United States Patent
Knecht et al.

(10) Patent No.: US 6,239,610 B1
(45) Date of Patent: May 29, 2001

(54) ARRANGEMENT FOR DETECTING JAMMING SITUATIONS IN ELECTRIC DRIVES

(75) Inventors: Gerhard Knecht, Iffezheim; Karl-Heinrich Preis; Holger Prüssel, both of Bühlertal, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/077,052

(22) Filed: Jul. 16, 1998

(30) Foreign Application Priority Data

Sep. 16, 1996 (DE) .............................. 196 37 631

(51) Int. Cl.[7] .................. G01R 31/34; G01R 31/06; H02K 17/32; G05B 5/00

(52) U.S. Cl. .................. 324/772; 324/545; 318/434; 318/455

(58) Field of Search .................. 318/434, 455; 324/772, 545; 361/31

(56) References Cited

U.S. PATENT DOCUMENTS

| | | | |
|---|---|---|---|
| 4,473,856 | * 9/1984 | Takahashi | 361/31 |
| 4,532,567 | * 7/1985 | Kade | 361/31 |
| 4,725,765 | * 2/1988 | Miller | 318/434 |
| 4,952,854 | 8/1990 | Periou et al. | |
| 5,773,945 | * 6/1998 | Kim, I | 318/434 |
| 5,801,503 | * 9/1998 | Kim, II | 318/434 |

FOREIGN PATENT DOCUMENTS

| | | |
|---|---|---|
| 28 20 330 | 11/1979 | (DE) . |
| 0 328 838 | 8/1989 | (EP) . |

* cited by examiner

*Primary Examiner*—Safet Metjahic
*Assistant Examiner*—Anjan K Deb
(74) *Attorney, Agent, or Firm*—Kenyon & Kenyon

(57) ABSTRACT

In an arrangement for detecting pinching situations in electric drives, provided in particular for window and sunroof openers in motor vehicles, the voltage induced in the armature of the motor is used, the induced voltage being determined from the voltage across the motor terminals and the current flowing in the armature, in particular as the difference between the voltage across the motor terminals and the product of the armature current by the armature resistance which is obtained periodically whenever possible. The armature resistance is obtained from the voltage across the motor terminals and the blocking current of the motor, the latter being determined by extrapolation of the armature current determined at a certain point in time. The armature current is measured using a shunt resistor and optionally amplified, and the current signal obtained is averaged using a microcontroller-controlled integrator with adjustable, computed integration periods, and digitized using an analog-digital converter.

15 Claims, 2 Drawing Sheets

ARRANGEMENT FOR DETECTING JAMMING SITUATIONS IN ELECTRIC DRIVES

FIELD OF THE INVENTION

The present invention (jamming) related to on an arrangement for detecting pinching situations in electric drives provided mainly for window and sunroof opening devices of motor vehicles.

BACKGROUND INFORMATION

In a conventional circuit arrangement described in German Patent Application No. 28 20 330 C2, a motor is provided, which is controlled by a switching unit in turn influenced by a motor monitor. The motor monitor derives a reset signal from a certain static motor current value and, in addition, detects, at least occasionally, a reset signal from a certain variation of the motor current over time. In this conventional arrangement, static and dynamic monitoring is performed, whereby the motor is switched off or its direction of rotation is reversed in the event of a sudden change in torque or increase in current due, for example, to the window pane hitting an obstacle, even if the instantaneous current is relatively low. The motor, however, is switched off or its direction of rotation is reversed even if, in the event of a gradual increase in the current to a value close to short-circuit current, a rapid further increase is no longer possible. In this case, therefore, two criteria are analyzed to detect a pinching (jamming) situation: the static motor current and the variation of the motor current over time.

In general, methods of monitoring the rotation speed to limit the force and prevent pinching jamming in displacement drives such as window and sunroof motors in motor vehicles, detecting gradual or abrupt changes in the rotation speed determined, for example, using Hall sensors, and deriving the required motor control signals therefrom, are also known.

SUMMARY OF THE INVENTION

The arrangement according to the present invention uses a different, advantageous approach. In the arrangement according to the present invention, the voltage induced in the motor armature is used to detect pinching (jamming) situations and to protect against pinching, (jamming) said voltage being determined from the voltage across the motor terminals and the current flowing in the motor armature.

In an embodiment of the present invention, the induced voltage is determined as the difference between the voltage across the motor terminals and the product of the armature current and armature resistance. According to another version of this embodiment, the armature resistance is determined periodically, in particular, at each new motor run.

According to another embodiment of the present invention, the armature resistance is determined from the voltage across the motor terminals and the blocking current of the motor. In yet another embodiment, the blocking current is determined by extrapolation of the armature current measured at a given point in time.

In a another embodiment of the present invention for simply and reliably implementing the invention, the current flowing in the armature is measured using a shunt resistor and digitized by means of an analog-digital converter after optional amplification.

In another embodiment of the present invention, the current signal determined from the current flowing in the armature is determined with the help of an integrator controlled by a microcontroller with adjustable, computed integration periods.

According to another embodiment of the present invention, the current signal determined from the current flowing in the armature is integrated over a plurality of commutation periods, in particular over 3 to 5 commutation periods.

In another embodiment of the present invention, the integration of the current signal determined from the current flowing through the armature is aborted when a threshold value is reached, the value determined is digitized and stored, the integration is resumed, and this procedure is continued until the entire adjusted and predefined integration period has elapsed.

According to another embodiment of the present invention, in order to trigger the pinching (jamming) protection, the current flowing in the armature is determined, which for actual triggering must be greater than a value composed of:

a determined value of the armature current, a correction value taking into account the change in the supply voltage over the time period of averaging, and a triggering value according to the following equation:

$$I_{Armature} > \overline{I_{Armature}} + \frac{U_{B_n} - U_{B_{n-1}}}{R_{Armature}} + I_S$$

In another embodiment of the present invention, the measured armature current values are stored in a memory, in particular, in a ring memory, and the oldest measured value is overwritten with the current measured value.

DETAILED DESCRIPTION OF THE DRAWINGS

According to the present invention, the voltage $U_{ind}$ is determined as a measure for detecting a pinching (jamming) situation. This voltage $U_{ind}$ induced in the motor armature cannot be determined by direct measurement. Therefore, according to the present invention, $U_{ind}$ is determined from the voltage $U_{kl}$ across the motor terminals and the current $I_A$ flowing in the motor armature. According to an another embodiment, if the armature resistance $R_A$ is known, $U_{ind}$ is determined as the difference between the voltage across the motor terminals $U_{KI}$ and the product of the armature current $I_A$ and armature resistance $R_A$ according to the following equation:

$$U_{IND} = U_{KI} - R_A \cdot I_A$$

The armature resistance $R_A$ is subject to great tolerances, such as manufacturing tolerances and temperature fluctuations. Therefore, according to another advantageous embodiment of the present invention, the armature resistance $R_A$ is determined regularly in the system. It is advantageous if armature resistor $R_A$ determined at the beginning of a motor run and made to serve as a basis for the subsequent computation steps.

The current $I_A$ flowing in the motor armature varies over time t according to an exponential function. In idling, the following equation applies:

$$I(t) = I_{Block} \cdot e^{-\left(\frac{t}{\tau_{mech}}\right)}$$

with $\tau_{mech}$ representing the mechanical time constant of the armature, i.e., its inertia.

Figure 1:
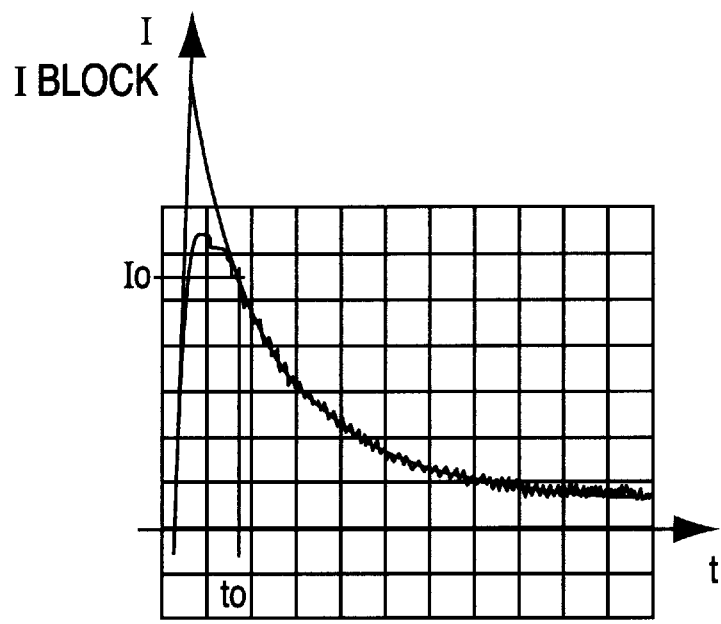
FIG. 1 shows a variation of the motor current together with commutation ripples superimposed thereon.

FIG. 1 shows the typical variation of the motor current I together with the superimposed commutation ripples plotted against time t. The armature current is limited by the armature inductance. Therefore, at the time the current is switched on, it is not the blocking current $I_{block}$ that flows, but an exponentially rising armature current with the electric time constant $\tau_{electrical}$, which is substantially smaller than $\tau_{mech}$. The starting current peak does not reach the full blocking current $I_{block}$, since the motor armature begins to rotate while the electric time constant $\tau_{elektrisch}$ elapses. The blocking current/starting current peak ratio only depends on the two time constants $\tau_{mech}$ and $\tau_{electrical}$, and is therefore constant. The armature resistance $R_A$ is determined at the beginning of each motor start from the terminal voltage $U_{Kl}$ applied to the motor and the blocking current $I_{block}$ at time $t_0$ after start: $R_A = U_{Kl}/I_{block}$. The armature resistance is assumed to be constant for the duration of a motor run. Strictly speaking, this is not the case, but it represents a good approximation assuming only a few seconds of motor running time.

As the graph of the motor current in FIG. 1 shows, commutation ripples are superimposed on the actual motor current $I_A$, which varies exponentially, and on the motor current signal resulting therefrom. The amplitude of these ripples is of the same order of magnitude as the signal changes caused by a pinching (jamming) situation. For this reason, these commutation ripples must be eliminated. According to another embodiment of the present invention, the current signal is averaged over a period of several commutation ripples, in particular over a period of 3 to 5 ripples, for this purpose.

Figure 2:
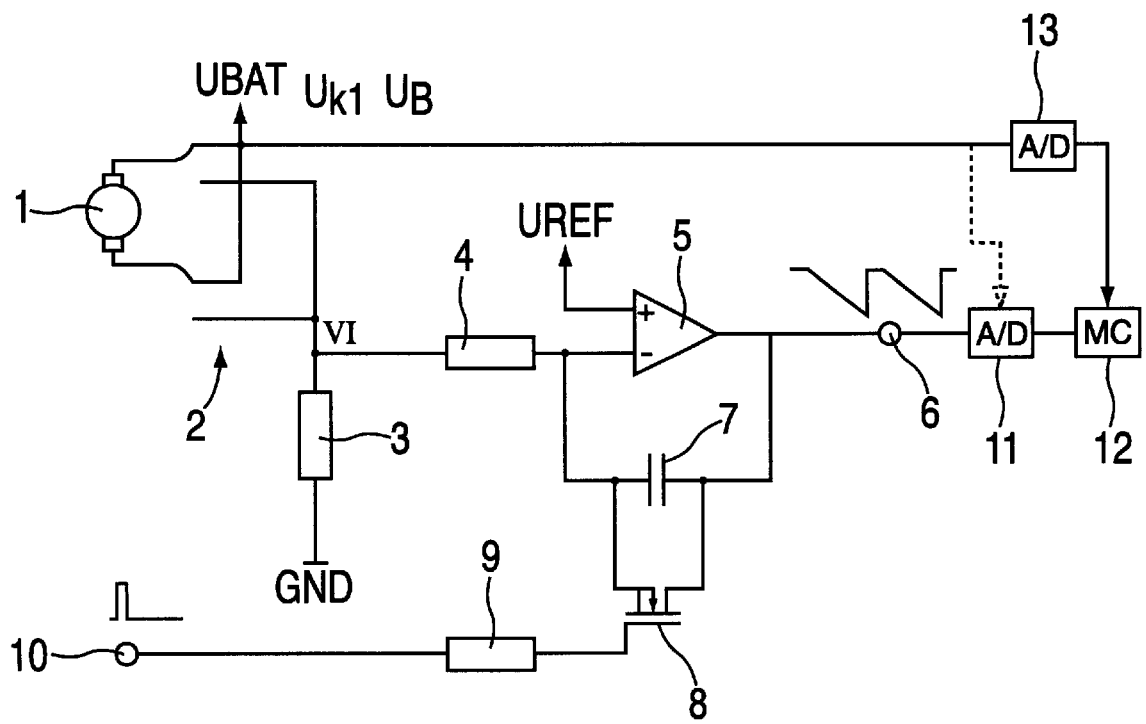
FIG. 2 shows a block diagram of at least a portion of the arrangement according to the present invention.

In the block diagram of the arrangement according to the present invention, shown in FIG. 2, a DC motor 1, can be connected, via a twin relay 2, to voltage $U_{Bat}$ of a car battery (not shown) or to a measuring resistor 3, a shunt, for measuring the motor current. One side of shunt 3 is grounded, while the other terminal is connected to the inverting input—of an operational amplifier 5 via a resistor 4. Thus the measured armature current of motor 1, picked up at shunt 3 and converted into a current signal V1, is amplified. Output 6 of operational amplifier 5 is back-coupled to the inverting input via a capacitor 7. Thus operational amplifier 5, together with capacitor 7, forms an integrator. A reference voltage $U_{ref}$, selected so that it is always greater than the maximum amplitude of current signal V1, corresponding to the blocking current, is applied to the non-inverting input+of operational amplifier 5. Capacitor 7 can be bridged by a transistor 8, in particular in the form of a MOSFET. Transistor 8 is controlled here with a turn-off pulse via a resistor 9 from input 10.

Thus, controlled by the turn-off pulse, capacitor 7 is short-circuited and discharged. The initial condition for integration is determined again and the integration can be restarted.

The integrated and amplified current signal V1 appearing at output 6 of operational amplifier 5 goes to an analog-digital converter 11 and a microcontroller 12 for analysis. The microcontroller generates, for example, the turn-off pulse supplied to input 10 to control the integration. At each turn-off pulse supplied, capacitor 7 is discharged and thus the voltage at output 6 and capacitor 7 can build up immediately thereafter. Integration is performed for a time period predetermined by the microcontroller. The integration is aborted a certain voltage value is reached and adding the digitized valued to that point until the integrator voltage value at the end of the predefined integration period.

Figure 3:
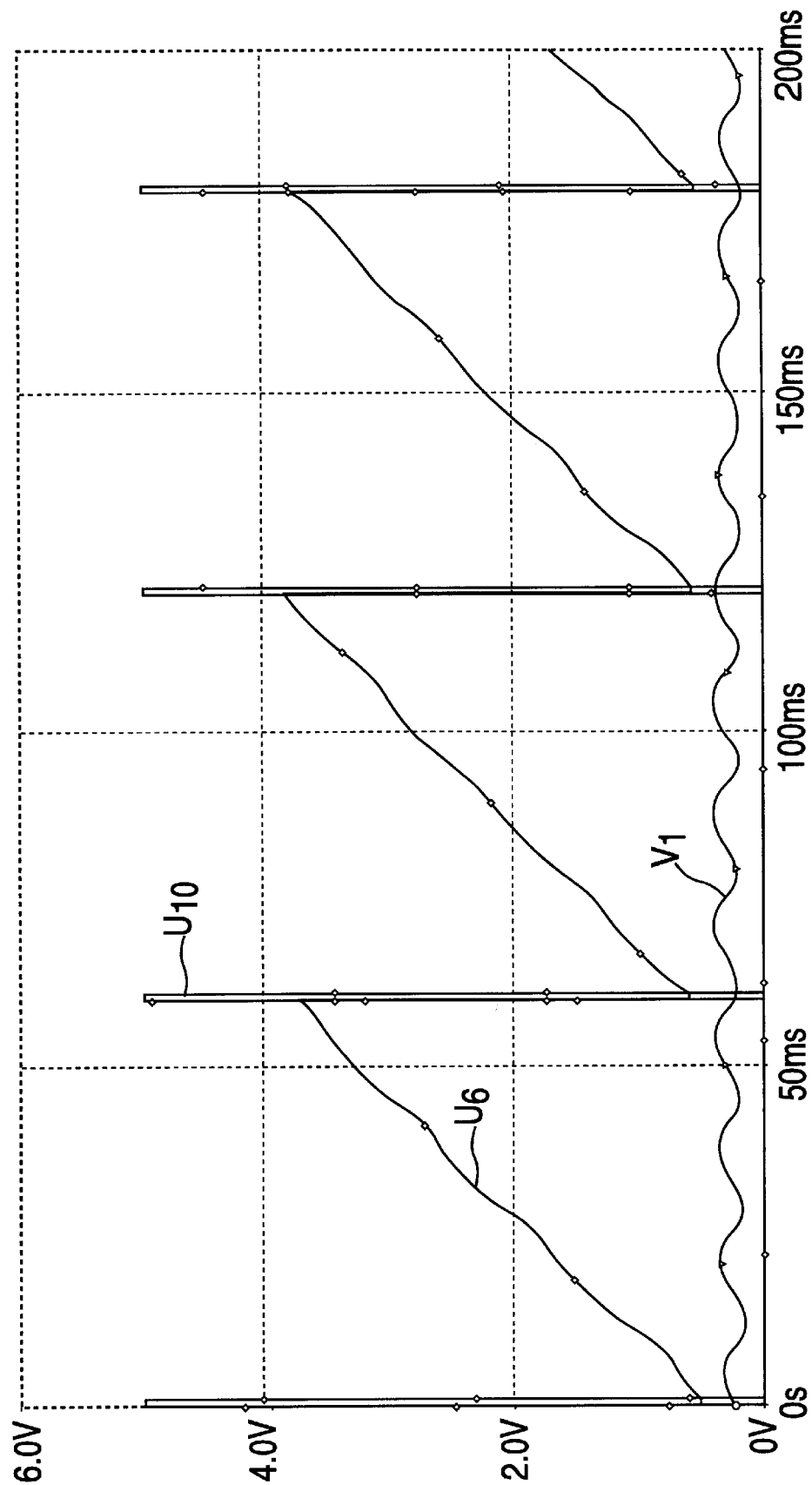
FIG. 3 shows a graphical representation of an integration of an armature current, a current signal derived therefrom and a voltage variation obtained therefrom.

FIG. 3 schematically shows the integration of the armature current and the current signal V1 derived therefrom, which is assumed to be sinusoidal. The total integration period shown is assumed to be 200 ms. To avoid overloading the integrator, the integration is aborted when a threshold value of approximately 3.7 V is reached. For this purpose, MOSFET 8 is turned on for approximately 1 ms, discharging capacitor 7. In the example illustrated, the threshold value is reached three times, and at the end, after the elapse of the predefined integration period of 200 ms, a voltage of 1.5 V is applied to capacitor 7, i.e., output 6 of operational amplifier 5. Thus, the total voltage value reached for the integration period of 200 ms is approximately (3×3.7 V)+1.5 V≈12.6 V. This value is determined in a digitized form by the analog-digital converter and is available for analysis.

In general, it should be noted that the integration constant of the integrator, formed basically by operational amplifier 5 and capacitor 7, is adjusted so that the modulation range of the integrator is almost fully utilized at the idling speed of motor 1. At lower speeds the integration time constant is greater. As mentioned above, in order to prevent overloading the integrator, the integration is aborted at the time a certain threshold value is reached. At such time, the voltage value is digitized using the analog-digital converter, and the integration period elapsed is subtracted from the total integration period adjusted to the rotation speed. Then capacitor 7 is discharged, through transistor 8 switched to the conductive state for about 1 ms, by means of the turn-off pulse delivered by the microcontroller via input 10, and integration is restarted. This procedure continues until the entire integration period has elapsed, the last integration being aborted not when a voltage level is exceeded, but when the integration period has elapsed. The value of the current determined is obtained from the following equation:

$$\overline{I_A}(t) = \frac{1}{t_j} \cdot \int_t^{t+t_j} I_A(t) \cdot dt$$

with $$t_j = \frac{4}{N}$$

The procedure described above provides the possibility of averaging over a fixed number of commutation ripples, in this case four ripples, under microcontroller control. In addition, the range of values of an 8-bit analog-digital converter can be extended by aborting the integration a plurality of times and adding the individual integration results. This is particularly valuable and advantageous because the dynamic range of the measurement is very large due to the possible fluctuations of the on-board electric system between 9 V and 15 V and the substantial variation in the motor speed.

According to another embodiment of the present invention, it is possible to determine the armature current that triggers the pinching (jamming) protection, the triggering threshold being advantageously adjusted to the actual on-board voltage, i.e., for example, voltage $U_{bat}$ of the vehicle battery.

If the motor terminal voltage $U_{kl}$ jumps while the load torque remains constant, armature current $I_A$ also makes a jump due to the mechanical inertia of the motor and the attached system. The increase in current is now only delayed by the armature inductance. If the armature resistance $R_A$ is known, then the following equation applies:

$$\frac{dI_{Armature}}{dt} = \frac{1}{R_{Armature}} \cdot \frac{dU_{Terminal}}{dt}$$

The limit value of the current variation should therefore be corrected with the change in the voltage across the terminals divided by the armature resistance $R_A$, $dU_{kl}/R_A$. After the elapse of a mechanical time constant of the system, the speed of the armature is stabilized again, and the armature torque (and the armature current that is proportional to it) re-assumes its previous value.

The limit value is obtained by averaging over the previously measured current values, to which the above correction term is added. The average value is approximated to the actual armature current by the subsequent averagings. Thus the averaging simulates the mechanical time constant of the armature, i.e., its inertia.

The measurement and evaluation procedure, where a microcontroller is advantageously used, is described below. The armature current values are stored in a memory, which is preferably a ring buffer memory. The oldest measured value in the ring buffer is overwritten with the most recent value. Averaging is performed by adding up all the measured values in the ring buffer and dividing the sum obtained by the number of measured values. At points in time predefined by the microcontroller, the current thus averaged and the instantaneous on-board voltage are measured. The correction term for the average current is obtained from the difference between the instantaneous on-board system voltage $UB_n$ and the on-board system voltage $UB_{n-1}$ determined in the previous measurement divided by the armature resistance $R_A$. Then the following condition can be used as a triggering criterion for the pinching (jamming) protection:

$$I_{Armature} > \overline{I_{Armature}} + \frac{U_{B_n} - U_{B_{n-1}}}{R_{Armature}} + I_S$$

where $I_s$ is a triggering threshold, which ensures that only significant changes in the armature current result in pinching (jamming) protection.

As described below, the individual steps of an actual programmed sequence is presented with reference to another embodiment.

Prior to turning on the motor (again), the idling voltage of the integrator is determined, the armature current being equal to zero. It serves as the basis for all the subsequent measurements. Since the ascent of the integrator output voltage is steepest in this operating mode, the measurement time selected should not be too large. Furthermore, it should be easy to recalculate it into the measurement time for determining the blocking current, in particular, using shift operations. In the this embodiment an idling integration period of 8 ms has been selected.

The maximum current is determined in the next step. The integrator is used for measuring the blocking current, as it is used for measuring the average armature current. Short measuring times (in this case 2 ms), are selected and consecutive measurements are performed until the maximum current is reached. An integrator voltage minimum at output 6 in FIG. 2 corresponds to the maximum current, since the integrator acts as an inverting device. To compute the integration result, the integration output voltage is initially recalculated from an integration period of 2 ms to 8 ms. For this recalculation, a constant input value for the integrator is assumed for the 2 ms integration period. The following is obtained:

$$J_a|_{8ms} = \frac{1}{\tau} \cdot \int_0^{8ms}(U_{Ref} - U_e(t))dt \approx 4 \cdot \frac{1}{\tau} \cdot \int_0^{2ms}(U_{Ref} - U_e(t)) \cdot dt$$

and as a measure of the maximum armature current, the following is obtained with $U_t(t) = R_{shunt} \cdot I_{Anker}$:

$$R_{Shunt} \cdot \frac{1}{\tau} \int_0^{8ms} I_{Armature_{max}} \cdot dt \approx R_{Shunt} \cdot$$

$$I_{Armature_{max}} \frac{8ms}{t} \approx \frac{8ms}{\tau} \cdot U_{Ref} - 4 \cdot U_a|_{min}$$

The armature resistance is computed as the next step. The blocking current $I_{block}$ of the armature is computed by multiplying the maximum current by a constant, which can be determined empirically. In this present case, the constant was determined to be equal to 1.25.

Immediately after measuring the armature current integral, the motor terminal voltage is measured. One measure for the armature resistance is obtained by dividing the instantaneous terminal voltage $U_{bat}$ or $U_{anker}$ by the blocking current $I_{block}$ of the armature:

$$R_{Armature} = \frac{U_{Armature}}{I_{Block}} = \frac{U_{Armature}}{1.25 \cdot I_{Armature_{max}}}$$

Instead of the armature current maximum, however, only the measured quantity normalized with the integration constant $\tau$ and multiplied by the constant shunt resistance is available. Thus, instead of the armature resistance $R_A$, a normalized armature resistance $\overline{R}$ is obtained:

$$\overline{R} = \frac{U_{Armature}}{1.25 \cdot I_{Armature_{max}} \cdot R_{Shunt} \cdot \frac{8ms}{\tau}} = \frac{R_{Armature}}{R_{Shunt}} \cdot \frac{\tau}{8ms}$$

To calculate this quotient, the value $U_{bat}$ is initially multiplied by an auxiliary constant, in this case by 32.5 times shift, so that a sufficient number of significant digits are obtained for the normalized armature resistance $-R$ after the division.

Then the averaged armature current is computed. To determine the instantaneous armature current while eliminating the commutation ripples, the armature current is averaged over an integration period T using the integrator. The following relationship is obtained:

$$\frac{1}{\tau}\int_0^T U_e(t) \cdot dt = \frac{R_{Shunt}}{\tau} \cdot \int_0^T I_{Armature}(t) \cdot dt = \frac{T}{\tau} \cdot U_{ref} - U_a(T)$$

$$= R_{Shunt} \cdot \frac{T}{\tau} \cdot \overline{I}_{Armature} = \hat{I}_{Armature}$$

The first integration period T is established as a fixed value, here 10 ms, after determining the armature resistance. To determine the current integral, the integrator idling voltage is scaled to this measurement time T again according to the following equation:

$$\frac{T}{\tau} \cdot U_{ref} = \frac{T_{LL}}{\tau} \cdot \frac{T}{T_{LL}}$$

With the equation given in the previous paragraph, a normalized, averaged armature current Î is obtained.

Finally, the induced voltage $U_{ind}$ is determined using the motor terminal voltage $U_{kl}$, normalized armature resistance $\overline{R}$ and normalized, averaged armature current Î.

$$\overline{R} \cdot \hat{I} = \frac{R_{Armature}}{R_{Shunt}} \cdot \frac{\tau}{8\text{ms}} \cdot \frac{T}{\tau} \cdot R_{Shunt} \cdot \overline{I}_{Armature} = R_{Anker} \cdot \overline{I}_{Armature} \cdot \frac{T}{8\text{ms}}$$

Thus the following is obtained for the induced voltage $U_{ind}$:

$$U_{ind} = U_{Armature} - R_{Armature} \cdot \overline{I}_{Armature} = U_{Armature} - \hat{R}\hat{I} \cdot \frac{8\text{ms}}{T}$$

The following integration period is determined from $U_{ind}$ using a ROM table. In one embodiment of the present invention, the integration periods vary between 5 ms and 31.5 ms with a quantization of 500 µs; the computation time in building the quotient must also be taken into account.

What is claimed is:

1. An arrangement for detecting a jamming situation in an electric drive, comprising:
    a measuring circuit to measure an armature current flowing in an armature of a motor; and
    a control device determining a voltage induced in the armature of the motor as a function of a measured voltage across terminals of the motor and the armature current flowing in the armature of the motor, the control device detecting the lamming situation as a function of the voltage induced in the armature of the motor.

2. The arrangement according to claim 1, wherein the motor is provided for at least one of a window opening device and a sunroof opening device in a motor vehicle.

3. The arrangement according to claim 1, wherein the induced voltage is determined by a difference between the measured voltage across the terminals of the motor and a product of the armature current and an armature resistance of the armature.

4. The arrangement according to claim 3, wherein the armature resistance is determined periodically.

5. The arrangement according to claim 4, wherein the armature resistance is determined for each run cycle of the motor.

6. The arrangement according to claim 4, wherein the armature resistance is determined as a function of the measured voltage across the terminals of the motor and a blocking current of the motor.

7. The arrangement according to claim 6, wherein the blocking current is determined by extrapolating the armature current measured at a predetermined time.

8. The arrangement according to claim 1, wherein the measuring circuit includes a shunt resistor measuring the armature current, and wherein the arrangement further comprises:

an analog-digital converter digitizing the armature current to form a current signal.

9. The arrangement according to claim 8, wherein armature current is amplified.

10. The arrangement according to claim 8, further comprising:
    a microcontroller-controlled integrator averaging the current signal at adjustable computed integration periods.

11. The arrangement according to claim 10, wherein the microcontroller-controlled integrator integrates the current signal over a plurality of the adjustable computed integration periods.

12. The arrangement according to claim 11, wherein a duration of the adjustable computed integration periods is equivalent to a duration of 3 to 5 commutation ripples.

13. The arrangement according to claim 11,
    wherein the microcontroller-controlled integrator stops integrating the current signal when a predetermined threshold value is reached and provides an integrated value of the current signal,
    wherein the integrated value is digitized and stored,
    wherein the microcontroller-controlled integrator restarts integrating the current signal after the integrated value is digitized and stored if one of the adjustable computed integration periods has not elapsed.

14. The arrangement according to claim 1,
    wherein the armature current is determined for triggering a blocking protection, and
    wherein, to actually trigger the blocking protection, the armature current is greater than a value formed from:
    (a) an averaged value of the armature current,
    (b) a correction value formed as a function of a change in the measured voltage across the terminals o the motor over an averaging period, and
    (c) a triggering value according to the following equation:

$$I_{Armature} > \overline{I_{Armature}} + \frac{U_{B_n} - U_{B_{n-1}}}{R_{Armature}} + I_S$$

wherein: $UB_n$ is an instantaneous on-board system voltage,
$UB_{n-1}$ is an on-board system voltage,
$I_S$ is a triggering threshold,
$I_{Armature}$ is the armature current, and
$R_{Armature}$ is an armature resistance.

15. The arrangement according to claim 14, wherein armature values of the armature current are stored in a memory device, and wherein an oldest value of the armature values in the memory device is overwritten by a most recent value.

* * * * *

UNITED STATES PATENT AND TRADEMARK OFFICE
CERTIFICATE OF CORRECTION

PATENT NO.    : 6,239,610 B1
DATED         : May 29, 2001
INVENTOR(S)   : Knecht et al.

It is certified that error appears in the above-identified patent and that said Letters Patent is hereby corrected as shown below:

Column 1
Line 6, delete "(jamming)".
Line 6, change "related to on" to -- relates to --.
Line 7, change "pinching" to -- pinching (jamming) --.
Line 33, change "pinching jamming" to -- pinching (jamming) --.
Line 45, change "pinching, (jamming)" to -- pinching (jamming), --.

Column 2,
Line 52, change "an another" to -- another --.
Line 65, change "$R_A$ determined" to -- $R_A$ is determined --.

Column 4,
Line 6, change "aborted a" to -- aborted when a --.

Column 7,
Line 34, change "lamming" to -- jamming --.

Signed and Sealed this

Fourth Day of June, 2002

*Attest:*

JAMES E. ROGAN
*Director of the United States Patent and Trademark Office*

*Attesting Officer*